US012641752B2

(12) United States Patent
Lian et al.

(10) Patent No.: US 12,641,752 B2
(45) Date of Patent: May 26, 2026

(54) WATER BLOCK WITH AIR-COOLING MODULE AND MULTI-LAYER HEAT-CONDUCTING STRUCTURE

(71) Applicant: Huizhou Xunshuo Technology Co., Ltd, Huizhou (CN)

(72) Inventors: Yanzhun Lian, Huizhou (CN); Fuyin Wang, Huizhou (CN)

(73) Assignee: Huizhou Xunshuo Technology Co., Ltd, Huizhou City (CN)

( * ) Notice: Subject to any disclaimer, the term of this patent is extended or adjusted under 35 U.S.C. 154(b) by 407 days.

(21) Appl. No.: 18/404,582

(22) Filed: Jan. 4, 2024

(65) Prior Publication Data

US 2024/0138110 A1    Apr. 25, 2024
US 2024/0237285 A9    Jul. 11, 2024

(30) Foreign Application Priority Data

Oct. 25, 2023    (CN) .......................... 202322877902.0

(51) Int. Cl.
H05K 7/20            (2006.01)

(52) U.S. Cl.
CPC ..... H05K 7/20272 (2013.01); H05K 7/20172 (2013.01); H05K 7/20263 (2013.01); H05K 7/2039 (2013.01)

(58) Field of Classification Search
CPC ........... H05K 7/20272; H05K 7/20172; H05K 7/20263; H05K 7/2039; H10W 40/47
See application file for complete search history.

(56) References Cited

U.S. PATENT DOCUMENTS

| | | | | |
|---|---|---|---|---|
| 6,019,165 A * | 2/2000 | Batchelder | ............ | H10W 40/43 |
| | | | | 165/80.4 |
| 6,166,907 A * | 12/2000 | Chien | .................... | H10W 40/47 |
| | | | | 361/689 |
| 10,375,856 B2 * | 8/2019 | Tsai | ...................... | H05K 7/2029 |
| 11,297,735 B2 * | 4/2022 | Lai | ...................... | H05K 7/20272 |
| 11,445,634 B2 * | 9/2022 | Yoon | ........................ | F04D 13/06 |
| 11,725,886 B2 * | 8/2023 | Mostafavi Yazdi | ...... | F28F 3/12 |
| | | | | 165/80.4 |
| 11,732,969 B2 * | 8/2023 | Chen | ...................... | F28D 1/0233 |
| | | | | 165/71 |
| 11,815,104 B2 * | 11/2023 | Fan | ........................ | F04D 29/026 |
| 11,856,733 B2 * | 12/2023 | Chen | .................. | H05K 7/20509 |
| 2006/0102324 A1 * | 5/2006 | Mok | ...................... | H10W 40/73 |
| | | | | 257/E23.099 |
| 2006/0185378 A1 * | 8/2006 | Duan | .................. | H05K 7/20263 |
| | | | | 62/259.2 |
| 2007/0000648 A1 * | 1/2007 | Crocker | ................ | F04D 29/588 |
| | | | | 257/E23.098 |

(Continued)

*Primary Examiner* — Mark A Laurenzi
*Assistant Examiner* — Benjamin Doyle

(57)            ABSTRACT

A water block includes an air-cooling module, a multi-layer heat-conducting structure and a water pump. The air-cooling module is provided above the water pump, and a pump bottom casing is provided below the water pump. The multi-layer heat-conducting structure is provided below the pump bottom casing, and a heat-conducting bottom casing is provided below the multi-layer heat-conducting structure. The multi-layer heat-conducting structure is formed, from top to bottom, by a top layer, a main body, an interlayer, and a bottom layer. A multi-layer heat-dissipation fin is provided inside the multi-layer heat-conducting structure.

9 Claims, 10 Drawing Sheets

(56) References Cited

U.S. PATENT DOCUMENTS

| | | | |
|---|---|---|---|
| 2007/0103869 A1* | 5/2007 | Liu | H10W 40/47 |
| | | | 257/E23.098 |
| 2009/0044929 A1* | 2/2009 | Yeh | F28D 1/05391 |
| | | | 165/104.19 |
| 2018/0172365 A1* | 6/2018 | Tsai | F28F 9/262 |
| 2020/0011609 A1 | 1/2020 | Chen et al. | |
| 2021/0195797 A1 | 6/2021 | Chen | |
| 2022/0159868 A1* | 5/2022 | Huang | H05K 7/20772 |
| 2024/0074105 A1* | 2/2024 | Tsai | F04D 29/4293 |
| 2024/0324138 A1* | 9/2024 | Chi | G06F 1/20 |

* cited by examiner

B

B

WATER BLOCK WITH AIR-COOLING MODULE AND MULTI-LAYER HEAT-CONDUCTING STRUCTURE

CROSS-REFERENCE TO RELATED APPLICATIONS

This application claims the benefit of priority from Chinese Patent Application No. 202322877902.0, filed on Oct. 25, 2023. The content of the aforementioned application, including any intervening amendments thereto, is incorporated herein by reference in its entirety.

TECHNICAL FIELD

This application relates to radiators, and more specifically to a water block with an air-cooling module and a multi-layer heat-conducting structure.

BACKGROUND

The radiator is used to conduct and release heat, and a water block is a common component used in the radiator. An ordinary water block merely adopts water cooling for heat dissipation without an air-cooling module, resulting in a limited heat dissipation effect.

Moreover, most of the water blocks in the prior art only use a single-layer fin structure for heat dissipation, which limits the heat dissipation ability. Furthermore, the heat dissipation effect of the casing of the water block that occupies a large area is also undesirable. Therefore, it is necessary to develop a novel heat dissipation structure that is different from the traditional single-layer fin structure, to enhance the heat dissipation efficiency of the core cooling structure while making full use of the casing for assisting the heat dissipation.

SUMMARY

An objective of the present disclosure is to provides a water block integrating an air-cooling module and a multi-layer heat-conducting structure to solve the above technical problems in the prior art.

Technical solutions of the present disclosure are described below.

This application provides a water block, comprising a water pump, an air-cooling module and a multi-layer heat-conducting structure. The air-cooling module is provided above the water pump. The existing common cooling fans are assembled and fixed on the water pump to constitute the air-cooling module, or fan blades are assembled on the turbine shaft of the water pump to achieve air-cooling and heat dissipation. Alternatively, an air-cooling shell matching with the shape of the water pump and the pump bottom casing is used to cover the water block, and air-cooling fan blades are arranged inside the air-cooling shell to constitute the air-cooling module. A pump bottom casing is provided below the water pump. A heat-conducting bottom casing is provided below the multi-layer heat-conducting structure. The cooling liquid is driven by the water pump to enter the multi-layer heat-conducting structure from the pump bottom casing for heat absorption and heat dissipation, and flows out of the water pump for circulation, so as to achieve water-cooling effects. A first portion of a heat pipe is provided above the multi-layer heat-conducting structure to fill the gap between the multi-layer heat-conducting structure and the pump bottom casing, and is configured to transfer parts of the heat to the pump bottom casing to assist in heat dissipation, thereby enhancing the cooling capacity of the water block. A second portion of the heat pipe is provided below the multi-layer heat-conducting structure to fill the gap between the multi-layer heat-conducting structure and the heat-conducting bottom casing, and is configured to conduct the heat to the interlayer of the multi-layer heat-conducting structure, so as to achieve multi-layer heat dissipation, thereby increasing the area of heat dissipation and improving the efficiency of heat dissipation. The multi-layer heat-conducting structure comprises the top layer, the main body, the interlayer and the bottom layer from top to bottom. A first heat dissipation fin with a multiple structure is provided inside the multi-layer heat-conducting structure and is configured to conduct the heat from the cooling liquid quickly.

In an embodiment, the air-cooling module comprises an air-cooling top cover, an air-cooling fan blade, and an air-cooling shell. The air-cooling top cover is an air inlet board in a circular grid-like shape. A fan motor is provided below or inside the air-cooling fan blade. The air-cooling top cover and the air-cooling fan blade are accommodated inside the upper part of the air-cooling shell.

In an embodiment, the air-cooling shell is cylindrical. The cylindrical diameter is greater than the diameter of an upper part of the water pump casing. The heat dissipation fin of the water pump casing is located inside the air-cooling shell. The L-shaped notch of the air-cooling shell provides a space for a water inlet of the pump bottom casing. A fan chamber is provided inside the air-cooled shell and is provided with the air-cooled fan blade. A snap-fit groove provided on the air-cooling top cover is provided above the fan chamber, which matches the air-cooling top cover. The snap-fit groove matches the shape of a buckling member below the air-cooling top cover, so as to fix the air-cooling top cover. A fan chamber separator is provided below the fan chamber, and is configured to separate the air-cooling fan blade from the water pump.

In an embodiment, a second heat dissipation fin is provided on an outer circumference of the pump bottom casing, and a side of the pump bottom casing is provided with a water inlet. The water inlet is connected to an external water-cooling circulation system. A position where the water inlet is located is corresponding to a position of the notch of the air-cooling shell, and an internal channel of the water inlet is in a transverse L-shape.

In an embodiment, the air-cooling module comprises an air-cooling fan blade. The air-cooling fan blade is bare, and is connected to a turbine axis of the water pump such that the fan blade can rotate together with the water pump when it is turned on to drive the air to blow downward or suck upward. In this case, the air flow is blown toward the heat dissipation fin of the pump bottom casing to enhance the heat dissipation efficiency.

In an embodiment, a first portion of a heat pipe is provided above the multi-layer heat-conducting structure, which fills the gap between the multi-layer heat-conducting structure and the pump bottom casing, and transfers parts of the heat to the pump bottom casing, so as to use the heat dissipation fin of the water pump base casing and the air-cooling module to assist the heat dissipation. A second portion of the heat pipe is provided below the multi-layer heat-conducting structure, which fills the gap between the multi-layer heat-conducting structure and the heat-conducting bottom casing, and transfers the heat from the heat-conducting bottom casing to the interlayer of the multi-layer heat-conducting structure, thereby achieving multi-layer heat dissipation and improving the heat dissipation efficiency.

In an embodiment, the heat pipe is U-shaped, and the multi-layer heat-conducting structure is sandwiched by the U-shaped heat pipe. The number of the heat pipe is one or more. The heat pipe is made of a high-thermal conductivity material.

In an embodiment, the first heat dissipation fin comprises a top heat-dissipation fin layer, a heat-dissipation fin interlayer and a bottom heat-dissipation fin layer. The top heat-dissipation fin layer is provided between the top layer of the multi-layer heat-conducting structure and the main body of the multi-layer heat-conducting structure. The heat-dissipation fin interlayer is provided between the main body of the multi-layer heat-conducting structure and the interlayer of the multi-layer heat-conducting structure. The bottom heat-dissipation fin layer is arranged between the interlayer of the multi-layer heat-conducting structure and the bottom layer of the multi-layer heat-conducting structure. Such design ensures that the size remains unchanged while making full use of the above space to improve the heat dissipation efficiency. The number of the top heat-dissipation fin layer is two groups, which are fixedly arranged on two sides of the top layer of the multi-layer heat-conducting structure, respectively. The number of the bottom heat-dissipation fin layer is one group, which is fixedly arranged on the middle of the bottom layer of the multi-layer heat-conducting structure to absorb the heat of the heat source. When dissipating heat, the cooling liquid and the heat pipe will conduct the heat to the top heat-dissipation fin layer, the heat-dissipation fin interlayer, and the bottom heat-dissipation fin layer to achieve the multi-layer heat dissipation, thereby improving the heat dissipation efficiency.

In an embodiment, the top layer of the multi-layer heat-conducting structure and the main body of the multi-layer heat-conducting structure together form a second chamber. The main body of the multi-layer heat-conducting structure, the interlayer of the multi-layer heat-conducting structure, and the bottom layer of the multi-layer heat-conducting structure together form a first chamber. The multi-layer heat-conducting structure is in the shape of a cross prism. A rectangular hollow is provided in the middle of the main body of the multi-layer heat-conducting structure. A middle and two sides of the interlayer of the multi-layer heat-conducting structure are each provided with a liquid channel such that the cooling liquid can pass through the heat-dissipation fin interlayer. The water pump is provided with a first water inlet and a first water outlet. The pump bottom casing is provided with a second water inlet and a second water outlet. The multi-layer heat-conducting structure is provided with a third water inlet and a third water outlet. The second water inlet is communicated with the third water inlet. The third water outlet is rectangular and is provided on the center of the top layer of the multi-layer heat-conducting structure. The third water outlet is communicated with the second water outlet. The cooling liquid flows from the second water inlet into the third water inlet, passes through the first chamber to the second chamber and then flows out of the third water outlet, and enters the first water inlet through the second water outlet and then flows out of the first water outlet. The cooling liquid successively passes through the bottom heat-dissipation fin layer, the heat-dissipation fin interlayer, and the top heat-dissipation fin layer, during which the cooling liquid absorbs the heat from the heat source and transfers parts of the heat to the pump bottom casing through the top heat-dissipation fin layers and the heat pipe. In this way, highly efficient heat dissipation can be achieved using the first heat dissipation fins and the cooperation of the pump bottom casing with the air-cooling module.

In an embodiment, a first bracket and a second bracket are provided between the pump bottom casing and the heat-conducting bottom casing. The first bracket and the second bracket are fixedly assembled on the water block. The brackets can fix the water block above the heat source, and the screw holes of the first bracket and the second bracket can be used to fix the existing or customized air-cooling module on the bracket for auxiliary heat dissipation.

The present disclosure has the following beneficial effects.

By adopting the above technical solutions, on one hand, the first heat dissipation fins are used to enhance the cooling efficiency of the core heat dissipation module; and on the other hand, the heat pipe is utilized to conduct the heat more uniformly to the entire water block, making full use of the heat dissipation fin of the pump bottom casing for auxiliary heat dissipation. Moreover, a fan finished product, a fan blade coaxial with the turbine, or a customized fan matching the water block is provided above the water pump. By rotating the fan blade to drive the air flow blowing to the heat dissipation fin of the pump bottom casing, thereby accelerating the heat dissipation efficiency of the pump bottom casing through air flows. Such arrangements fully use the entire water block and the space thereabove, so as to achieve rapid heat dissipation under the limited space and the rated flow rate.

BRIEF DESCRIPTION OF THE DRAWINGS

To more clearly illustrate the technical solutions of the embodiments of the present disclosure, the accompanying drawings needed in the description of embodiments will be briefly introduced. It should be understood that the following drawings only show some embodiments of the present disclosure, and therefore should not be regarded as a limitation to the scope of the present disclosure. Other relevant drawings can be obtained by one of ordinary skill in the art according to the accompanying drawings provided herein without making creative effort.

Figure 1:
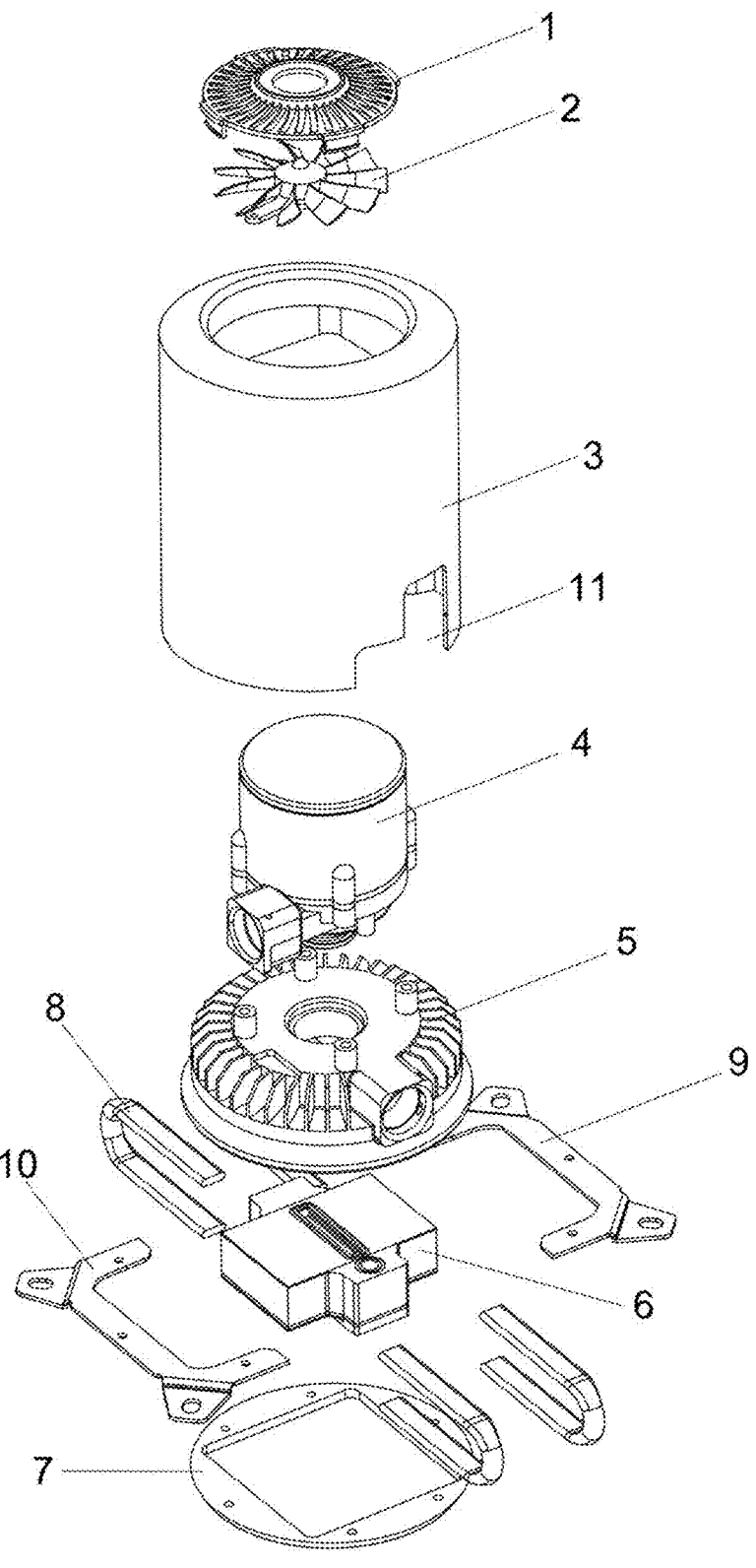
FIG. 1 is an exploded view of a water block according to an embodiment of the present disclosure.

In the drawings: 1, air-cooling top cover; 2, air-cooling fan blade; 3, air-cooling shell; 4, water pump; 5, pump bottom casing; 6, multi-layer heat-conducting structure; 7, heat-conducting bottom casing; 8, heat pipe; 9, first bracket;

10, second bracket; 11, notch; 12, fixing column; 13, first water inlet; 14, first water outlet; 15, second heat dissipation fin; 16, second water inlet; 17, second water outlet; 18, third water inlet; 19, third water outlet; 20, top layer; 21, main body; 22, interlayer; 23, bottom layer; 24, top heat-dissipation fin layer; 25, heat-dissipation fin interlayer; 26, bottom heat-dissipating fin layer; 27, first chamber; 28, second chamber; 29, fan chamber; 30, separator; and 31, snap-fit groove.

DETAILED DESCRIPTION OF EMBODIMENTS

For better understanding of the present disclosure, the present disclosure will be described in detail below with reference to the relevant accompanying drawings. Preferred embodiments of the present disclosure are presented in the accompanying drawings. However, the present disclosure can be implemented in many different forms, and is not limited to the embodiments described herein. On the contrary, these embodiments are provided to render the present disclosure more understandable.

It is noted that when an element is defined to be "fixed" to another element, it may be directly fixed or indirectly fixed through an intermediate element. When an element is defined to be "connected" to another element, it may be directly or indirectly connected to the other element. The terms used herein, such as "vertical," "horizontal," "left," and "right", are merely for illustrative purposes, and are not intended to limit the implementation manner.

Unless otherwise defined, all technical and scientific terms used herein have the same meaning as commonly understood by those skilled in the art. Terms used in the specification of the present disclosure are only for the purpose of describing specific embodiments, and are not intended to limit the present disclosure. As used herein, the term "and/or" includes any and all combinations of one or more of the relevant listed items.

Figure 2:
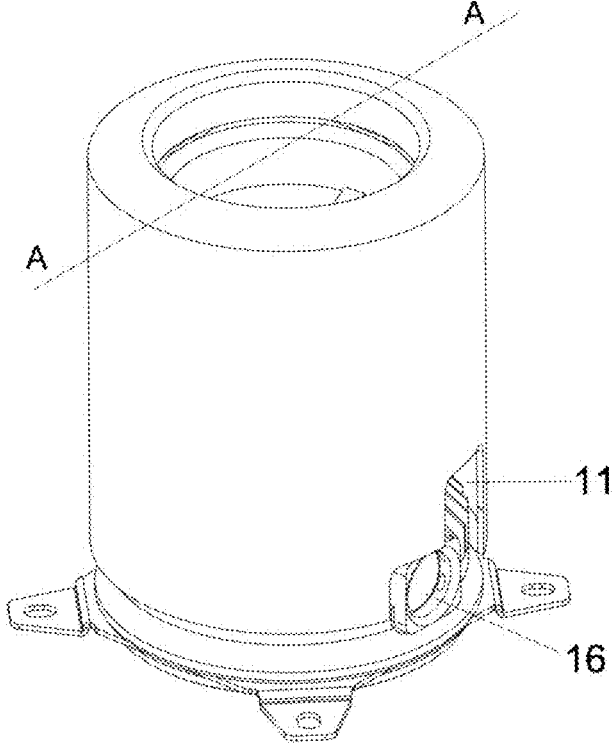
FIG. 2 is a perspective view of the water block according to an embodiment of the present disclosure.
Figure 3:
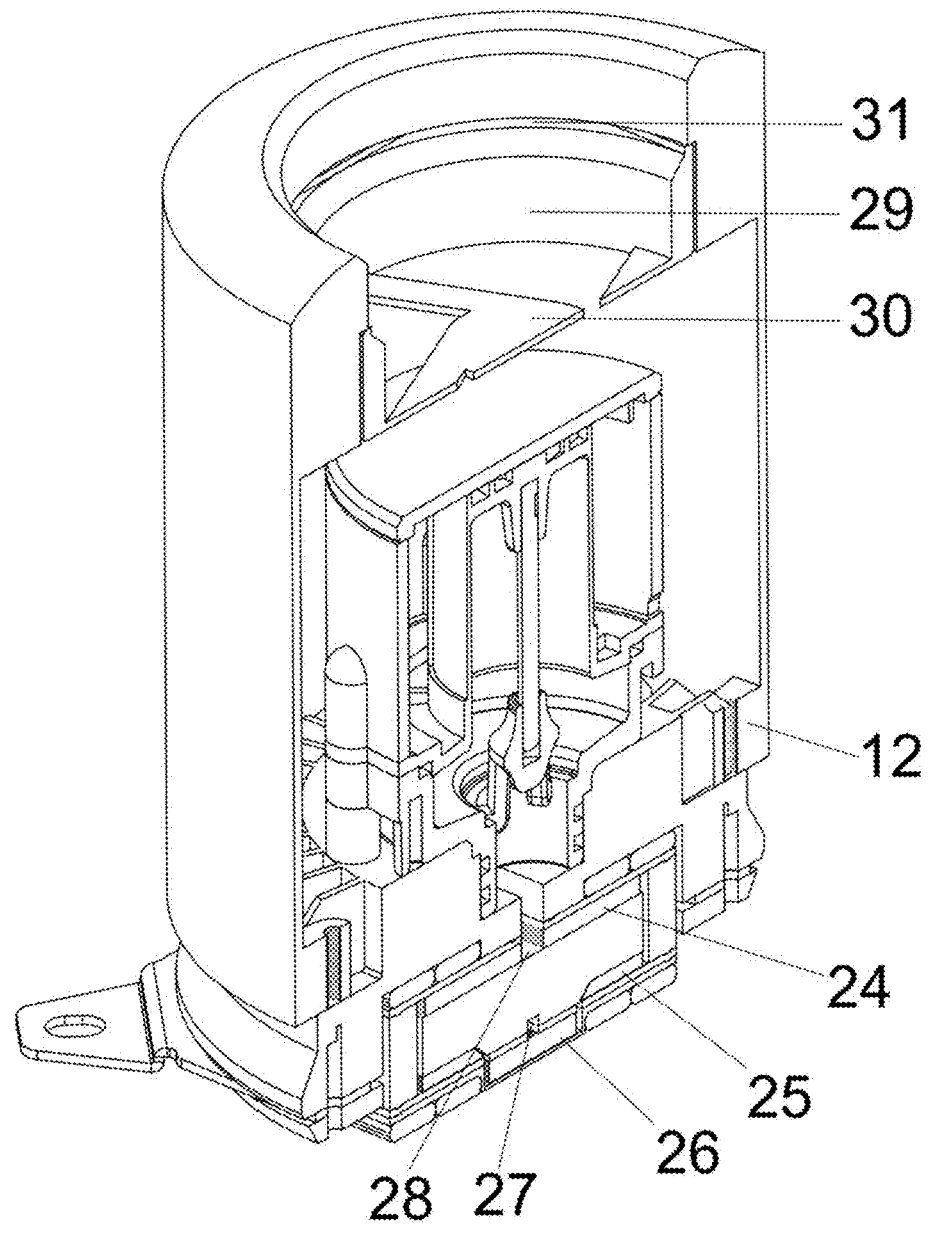
FIG. 3 is a sectional view of FIG. 2 along A-A line.
Figure 4:
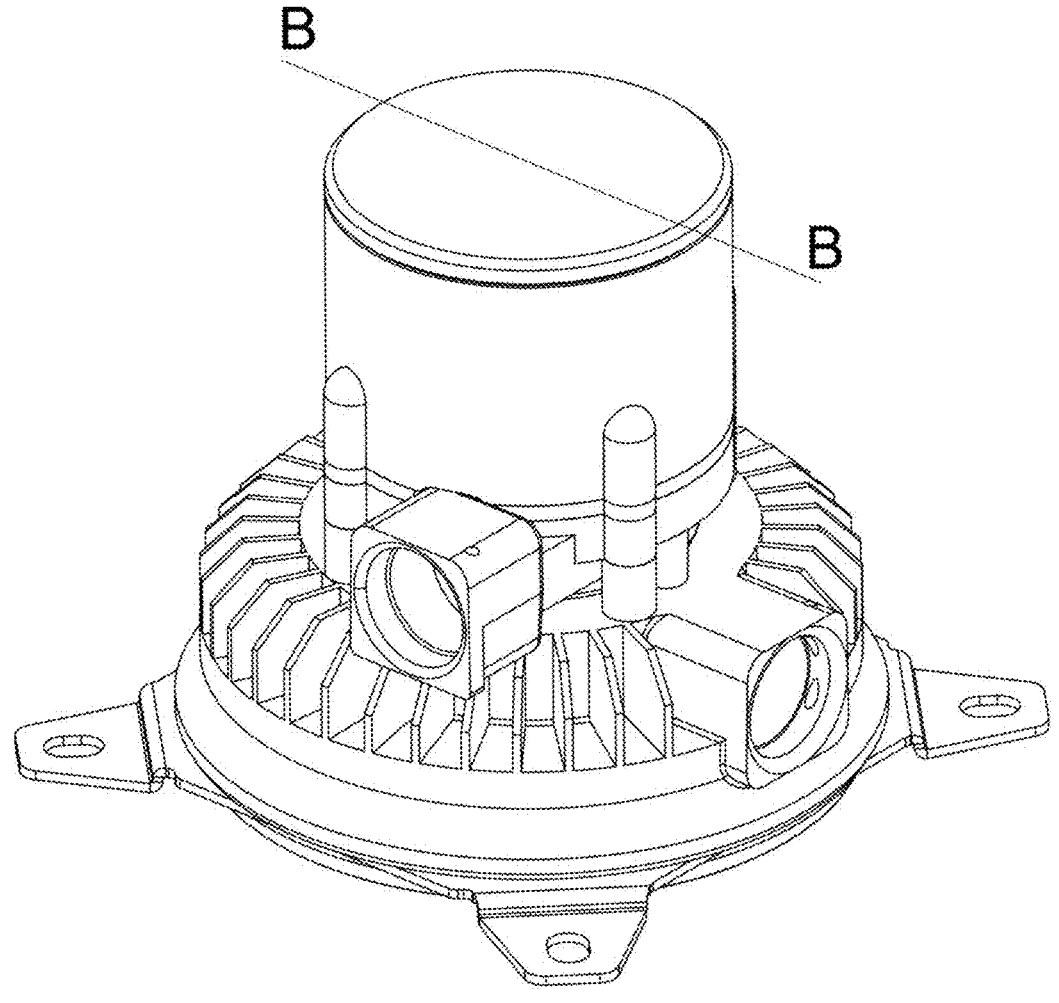
FIG. 4 is a perspective view of the water block without an air-cooling module according to an embodiment of the present disclosure.
Figure 5:
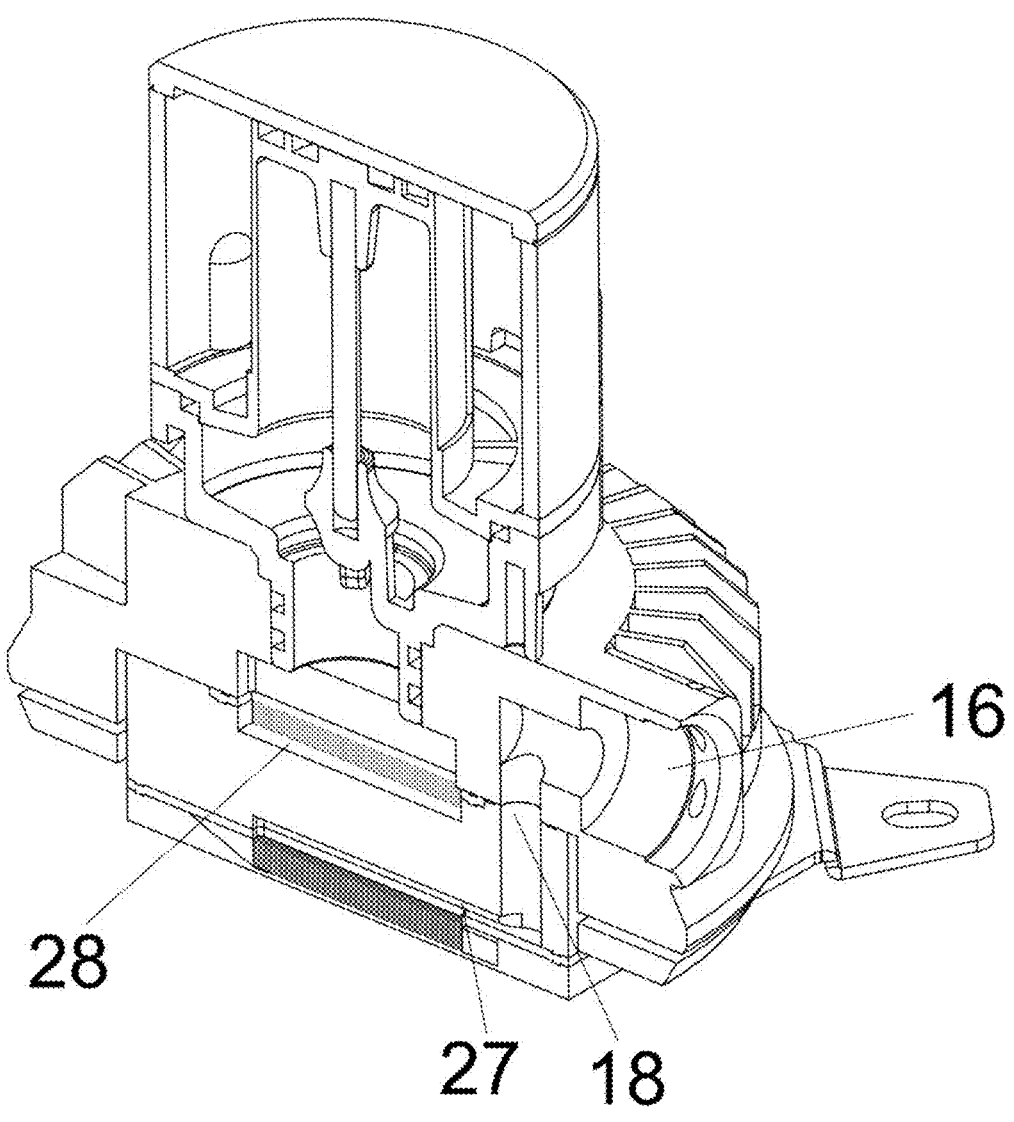
FIG. 5 is a sectional view of FIG. 4 along B-B line.
Figure 6:
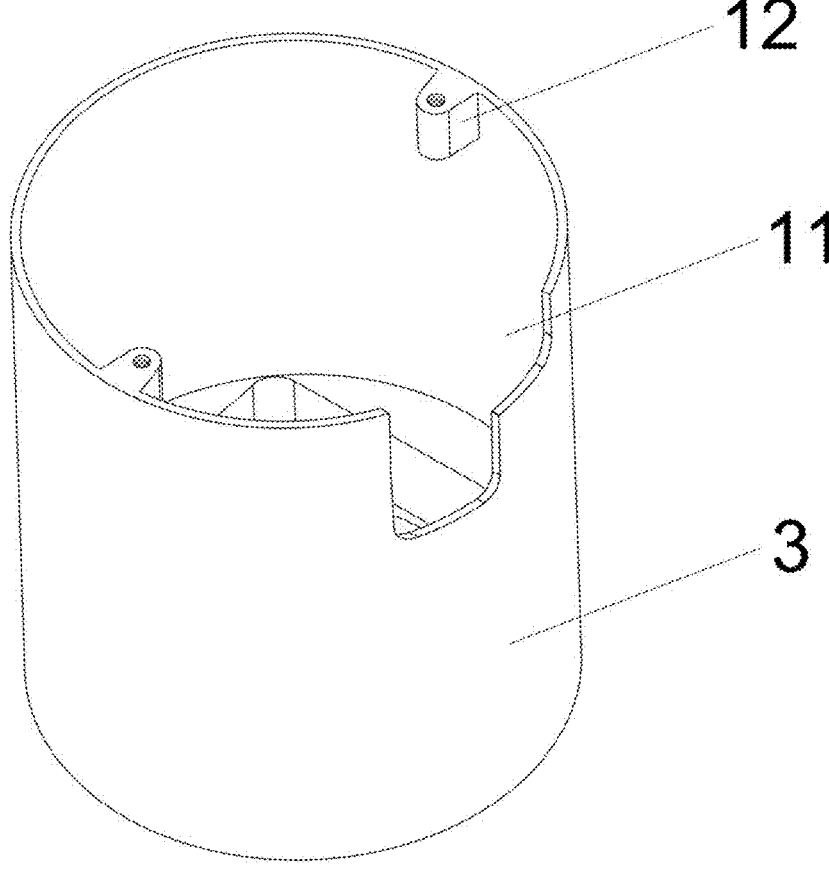
FIG. 6 is a perspective view of a fan housing according to an embodiment of the present disclosure.
Figure 7:
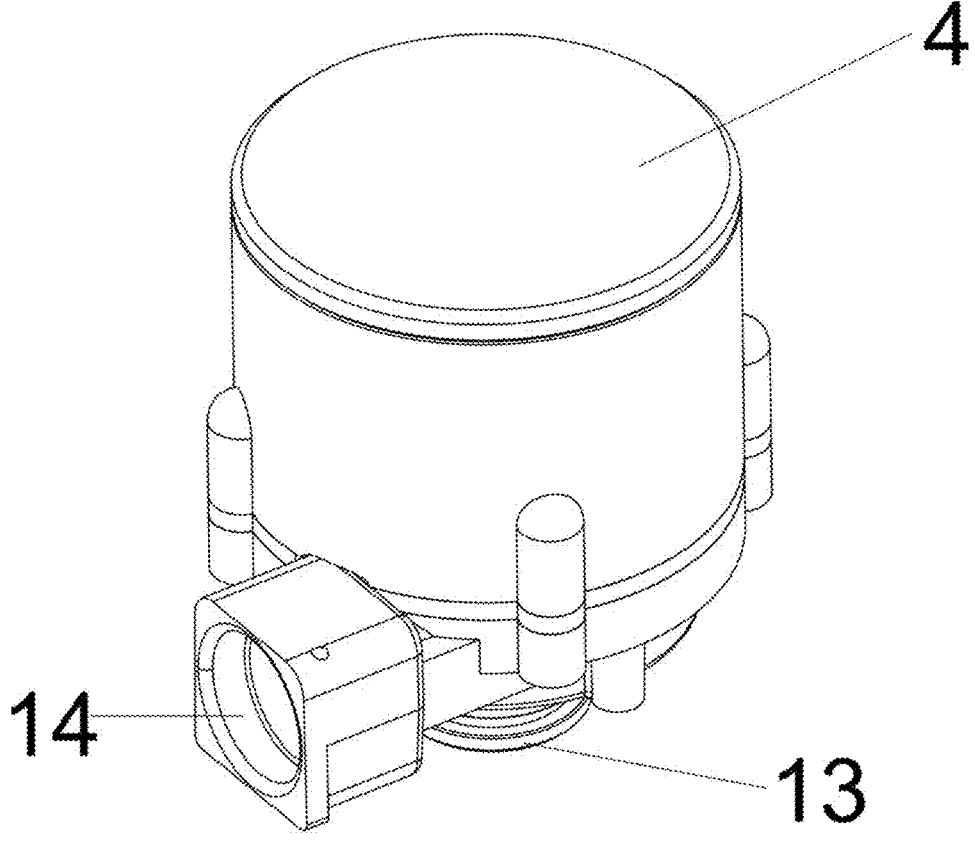
FIG. 7 is a perspective view of a water pump according to an embodiment of the present disclosure.
Figure 8:
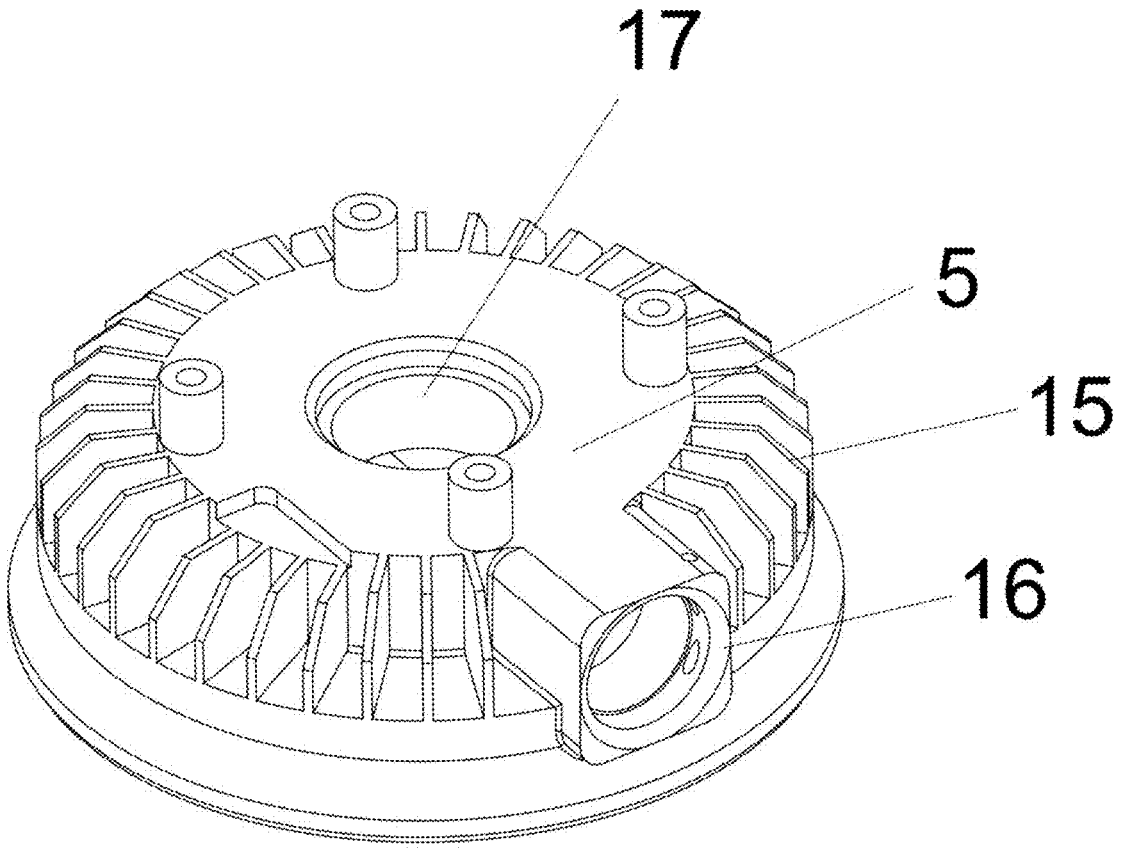
FIG. 8 is a perspective view of a pump bottom casing according to an embodiment of the present disclosure.
Figure 9:
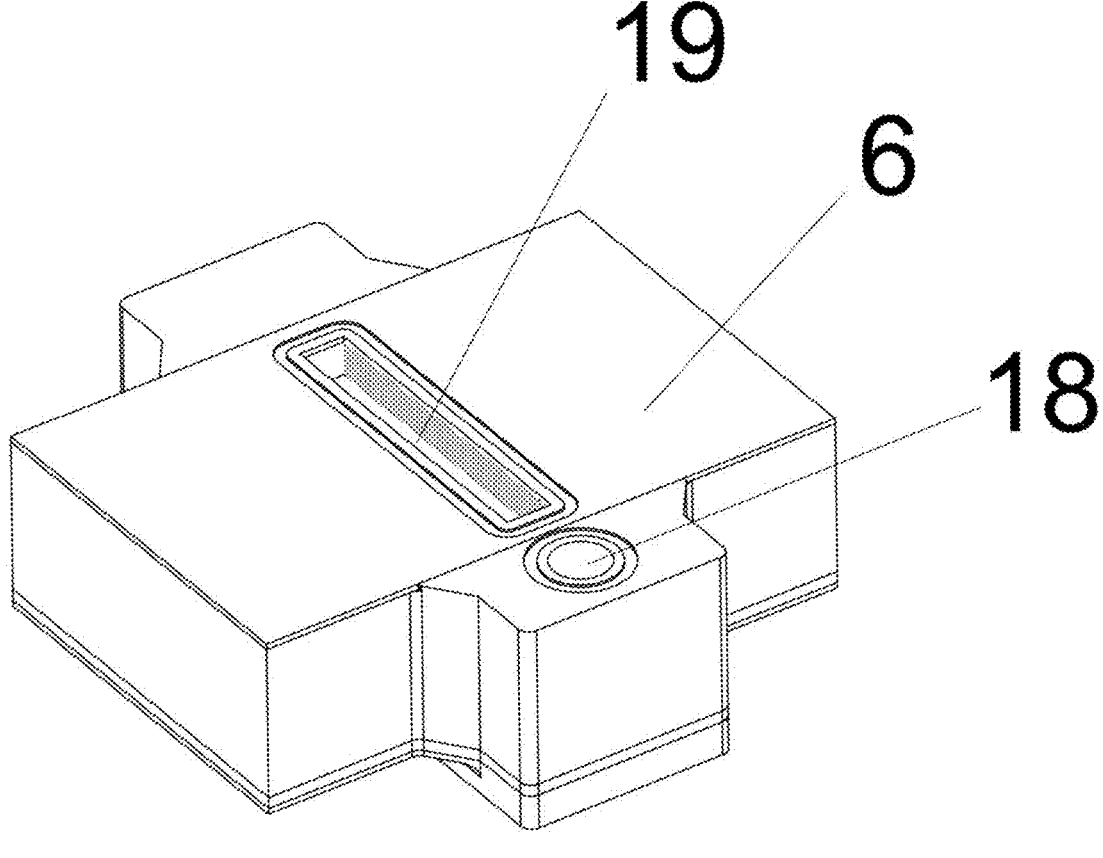
FIG. 9 is a perspective view of a multi-layer heat-conducting structure according to an embodiment of the present disclosure.
Figure 10:
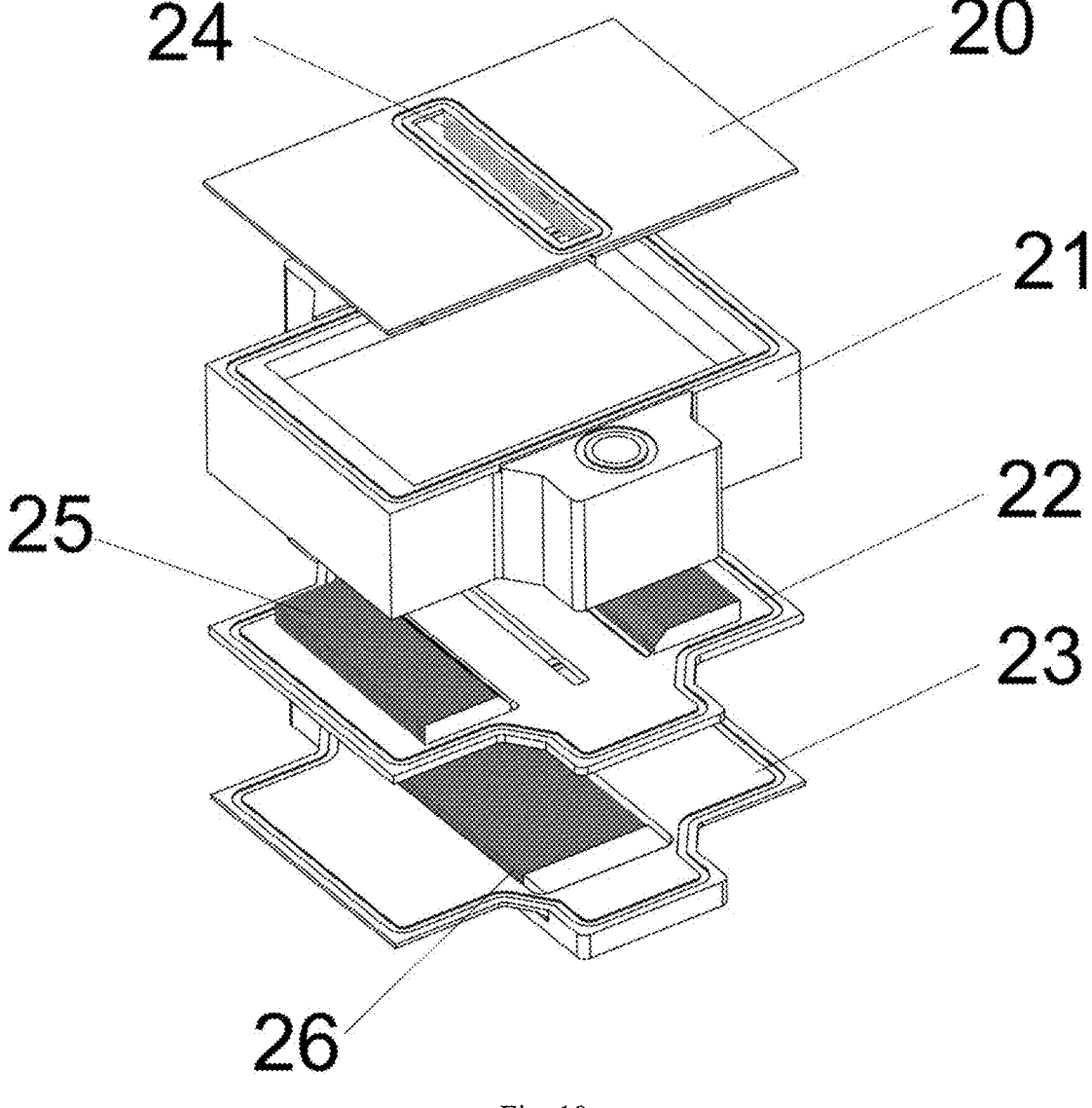
FIG. 10 is an exploded view of the multi-layer heat-conducting structure according to an embodiment of the present disclosure.

Referring to FIGS. 1-10, an embodiment of the present disclosure provides a water block, which includes an air-cooling module, a multi-layer heat-conducting structure and a water pump 4. The air-cooling module is provided above the water pump 4, and a pump bottom casing 5 is provided below the water pump 4. The multi-layer heat-conducting structure 6 is provided below the pump bottom casing 5, and a heat-conducting bottom casing 7 is provided below the multi-layer heat-conducting structure 6. The multi-layer heat-conducting structure 6 is formed from top to bottom by a top layer 20, a main body 21, an interlayer 22, and a bottom layer 23. A first heat dissipation fin with a multi-layer structure is provided inside the multi-layer heat-conducting structure 6.

By adopting the above technical solutions, the air-cooling module is provided above the water pump 4. The existing common cooling fans are assembled and fixed on the water pump 4 to constitute the air-cooling module, or fan blades are assembled on the turbine shaft of the water pump 4 to achieve air-cooling and heat dissipation. Alternatively, an air-cooling shell 3 matching with the shape of the water pump 4 and the pump bottom casing 5 is used to cover the water block, and air-cooling fan blades 2 are arranged inside the air-cooling shell 3 to constitute the air-cooling module. By blowing air to the pump bottom casing 5 through the air-cooling module, the air flow passing through a second heat dissipation fin 15 of the pump bottom casing is increased, which can faster take away more heat and thus increase the cooling efficiency. The cooling liquid is driven by the water pump 4 to enter the multi-layer heat-conducting structure 6 from the pump bottom casing 5 for heat absorption and heat dissipation, and flows out of the water pump 4 for circulation, so as to achieve water cooling effects. A first portion of a heat pipe 8 is provided above the multi-layer heat-conducting structure 6 to fill the gap between the multi-layer heat-conducting structure 6 and the pump bottom casing 5, and is configured to transfer parts of the heat to the pump bottom casing 5 to assist in heat dissipation, thereby enhancing the cooling capacity of the water block. A second portion of the heat pipe 8 is provided below the multi-layer heat-conducting structure 6 to fill the gap between the multi-layer heat-conducting structure 6 and the heat-conducting bottom casing 7, and is configured to conduct the heat to the interlayer 22 of the multi-layer heat-conducting structure, so as to achieve multi-layer heat dissipation, thereby increasing the area of heat dissipation and improving the efficiency of heat dissipation. The multi-layer heat-conducting structure 6 includes the top layer 20, the main body 21, the interlayer 22, and the bottom layer 23 from top to bottom, forming a multi-chamber layered heat dissipation, which makes full use of the upper space to increase the heat dissipation area and improve the heat dissipation efficiency. The first heat dissipation fin with a multiple structure is provided inside the multi-layer heat-conducting structure 6 and is configured to conduct the heat from the cooling liquid quickly.

Preferably, the air-cooling module includes an air-cooling top cover 1, an air-cooling fan blade 2, and an air-cooling shell 3.

By adopting the above technical solution, the circular grid-like air-cooling top cover 1 is configured to protect the air-cooling fan blade 2 and block debris from being sucked in to damage the air-cooling module. A fan bracket is provided below the air-cooling fan blade 2. A fan motor is provided on or inside the air-cooling fan blade 2, which drives the air-cooling fan blade 2 to rotate. The air-cooling top cover 1 and the air-cooling fan blade 2 are accommodate inside the upper part of the air-cooling shell 3, and the air-cooling fan blade 2 is located below the air-cooling top cover 1. The air-cooling shell 3 is configured to protect the air-cooling fan blade 2 from being damaged, and the cylindrical air-cooling shell 3 plays the role of collecting air flow and blowing the air flow to the second heat dissipation fins 15 of the pump bottom casing to the maximum extent, thereby improving the air-cooling efficiency.

Preferably, the air-cooling shell 3 is cylindrical, and is provided with an L-shaped notch 11. A fan chamber 29 is provided inside the air-cooling shell 3. A snap-fit groove 31 is provided above the fan chamber 29 and matches with the air-cooling top cover 1. A fan chamber separator 30 is provided below the fan chamber 29.

By using the above technical solutions, the cylindrical air-cooling shell 3 can better collect the air flow, and has less turbulence compared with air-cooling shells with an irregular shape. The cylindrical diameter is greater than the diameter of an upper part of the pump bottom casing 5. The second heat dissipation fin 15 is located inside the air-cooling shell 3, so that the air flow can be fully utilized to blow to the second heat dissipation fin 15 to take away the heat. The L-shaped notch of the air-cooling shell 3 provides a space for a second water inlet 16 of the pump bottom casing. The fan chamber 29 inside the air-cooled shell 3 is provided with the air-cooling fan blade 2. The snap-fit groove 31 on the air-cooling top cover above the fan chamber 29 matches the shape of a buckling member below the air-cooling top cover 1, so as to fix the air-cooling top cover 1. The fan chamber separator 30 of the fan chamber 29 is configured to separate the air-cooling fan blade 2 from the water pump 4 and support the air-cooling fan blade 2.

Preferably, the second heat dissipation fin 15 is provided on an outer circumference of the pump bottom casing 5, and the second water inlet 16 is provided on a side of the pump bottom casing 5. A position where the second water inlet 16 is located matches the notch 11 of the air-cooling shell.

By adopting the above technical solutions, the second heat dissipation fin 15 provided on the outer circumference of the pump bottom casing 5 increases the heat dissipation area and assists the heat dissipation of the water block. The second water inlet 16 provided on the side of the pump bottom casing is connected to an external water-cooling circulation system. The position where the second water inlet 16 is located is corresponding to a position of the notch 11 of the air-cooling shell, and an internal channel of the second water inlet 16 is in a transverse L-shape.

Preferably, the air-cooling module includes an air-cooling fan blade 2, and the air-cooling fan blade 2 is connected to the turbine axis of the water pump 4.

By adopting the above technical solutions, the bare air-cooling fan blade 2 using the same turbine axis as the water pump 4 constitutes the simplest air-cooling module. The air-cooling fan blade 2 is arranged on the turbine axis such that the fan blade rotates together with the water pump 4 when it is turned on to drive the air to blow downward or suck upward. In this case, the air flow passes through the second heat dissipation fins 15 of the pump bottom casing to take away the heat, thereby enhancing the efficiency of heat dissipation.

Preferably, a first portion of a heat pipe 8 is provided above the multi-layer heat-conducting structure 6, and a second portion of the heat pipe 8 is provided below the multi-layer heat-conducting structure 6.

By adopting the above technical solutions, the first portion of the heat pipe 8 above the multi-layer heat-conducting structure 6 fills the gap between the multi-layer heat-conducting structure 6 and the pump bottom casing 5, and transfers parts of the heat to the pump bottom casing 5, so as to use the second heat dissipation fins 15 of the water pump base casing and the air-cooling module to assist in the heat dissipation. The second portion of the heat pipe 8 below the multi-layer heat-conducting structure 6 fills the gap between the multi-layer heat-conducting structure 6 and the heat-conducting bottom casing 7, and transfers the heat from the heat-conducting bottom casing 7 to the interlayer 22 of the multi-layer heat-conducting structure, thereby achieving multi-layer heat dissipation and improving the heat dissipation efficiency.

Preferably, the heat pipe 8 is U-shaped, and the number of the heat pipe 8 is four.

By adopting the above technical solutions, the multi-layer heat-conducting structure 6 is sandwiched by the four U-shaped heat pipes 8, and the four heat pipes 8 are made of a high-thermal conductivity material.

Preferably, the first heat-dissipation fin includes a top heat-dissipation fin layer 24, a heat-dissipation fin interlayer 25, and a bottom heat-dissipation fin layer 26. The top heat-dissipation fin layer 24 is provided between the top layer 20 of the multi-layer heat-conducting structure and the main body 21 of the multi-layer heat-conducting structure. The heat-dissipation fin interlayer 25 is provided between the main body 21 of the multi-layer heat-conducting structure and the interlayer 22 of the multi-layer heat-conducting structure. The bottom heat-dissipation fin layer 26 is arranged between the interlayer 22 of the multi-layer heat-conducting structure and the bottom layer 23 of the multi-layer heat-conducting structure.

By adopting the above technical solutions, the top heat-dissipation fin layer 24 located between the top layer 20 of the multi-layer heat-conducting structure and the main body 21 of the multi-layer heat-conducting structure conducts the heat upwards. The heat-dissipation fin interlayer 25 located between the main body 21 of the multi-layer heat-conducting structure and the interlayer 22 of the multi-layer heat-conducting structure absorbs the heat transferred by the heat pipe 8. The bottom heat-dissipation fin layer 26 located between the interlayer 22 of the multi-layer heat dissipation structure and the bottom layer 23 of the multi-layer heat dissipation structure absorbs the heat of the heat source. Such design ensures that the size remains unchanged while making full use of the above space to improve the heat dissipation efficiency. The number of the top heat-dissipation fin layer 24 is two groups, which are fixedly arranged on two sides of the top layer 20 of the multi-layer heat-conducting structure, respectively. The two groups of the top heat-dissipation fin layer 24 have a larger heat dissipation area and a higher heat dissipation efficiency. The number of the bottom heat-dissipation fin layer 26 is one group, which is fixedly arranged on the middle of the bottom layer 23 of the multi-layer heat-conducting structure to absorb the heat of the heat source. When dissipating heat, the cooling liquid and the heat pipe 8 will conduct the heat to the top heat-dissipation fin layer 24, the heat-dissipation fin interlayer 25, and the bottom heat-dissipation fin layer 26 to achieve the multi-layer heat dissipation, thereby improving the heat dissipation efficiency.

Preferably, the top layer 20 of the multi-layer heat-conducting structure and the main body 21 of the multi-layer heat-conducting structure together form a second chamber 28. The main body 21 of the multi-layer heat-conducting structure, the interlayer 22 of the multi-layer heat-conducting structure, and the bottom layer 23 of the multi-layer heat-conducting structure are configured to together form a first chamber 27. The water pump 4 is provided with a first water inlet 13 and a first water outlet 14. The pump bottom casing 5 is provided with a second water inlet 16 and a second water outlet 17. The multi-layer heat-conducting structure 6 is provided with a third water inlet 18 and a third water outlet 19. The cooling liquid flows from the second water inlet 16 into the third water inlet 18, passes through the first chamber 27 to the second chamber 28 and then flows out of the third water outlet 19, and enters the first water inlet 13 through the second water outlet 17 and then flows out of the first water outlet 14.

By adopting the above technical solutions, the multi-layer heat-conducting structure 6 that is in the shape of a cross prism is provided with the first chamber 27 and the second chamber 28. The second water inlet 16 having a L-shaped channel makes the cooling liquid enter into the third water inlet 18 located at one end of the multi-layer heat-conducting structure 6. The wider rectangle outlet can improve the flow speed of the cooling liquid. The cooling liquid enters the third water inlet 18 from the second water inlet 16, passes through the first chamber 27 to the second chamber 28 and then flows out of the third water outlet 19, and enters the first water inlet 13 through the second water outlet 17 and then flows out of the first water outlet 14. After that, the water pump 4 allows the cooling liquid to enter the second water inlet 16 from the first water outlet 14 through external pipelines, and so on to achieve the heat dissipation cycle. The cooling liquid successively passes through the bottom heat-dissipation fin layer 26, the heat-dissipation fin interlayer 25, and the top heat-dissipation fin layer 24, during which the cooling liquid absorbs the heat from the heat source and transfers parts of the heat to the pump bottom casing 5 through the top heat-dissipation fin layers 24 and the heat pipe 8. In this way, highly efficient heat dissipation can be achieved using the first heat dissipation fins and the cooperation of the pump bottom casing 5 with the air-cooling module.

Preferably, a first bracket 9 and a second bracket 10 are provided between the pump bottom casing 5 and the heat-conducting bottom casing 7.

By adopting the above technical solutions, the first bracket 9 and the second bracket 10 provided between the pump bottom casing 5 and the heat-conducting bottom casing 7 are fixedly assembled on the water block. The brackets can fix the water block above the heat source, and the screw holes of the first bracket 9 and the second bracket can be used to fix the existing or customized air-cooling module on the bracket.

The working principles of the heat dissipation are described below. The heat of the heat source is conducted more uniformly to different layers of the heat dissipation fins and the base of the water pump 4 by using the heat pipes 8 and the multi-layer heat-conducting structure 6. In this way, the cooling liquid can perform rapid heat dissipation when passing through the different layers of the heat dissipation fins, and the water block can be fully used for auxiliary cooling. In addition, an air-cooling module is provided above the water pump 4, so that the air flow will take away a large amount of heat when passing through the second heat dissipation fins 15 of the pump bottom casing, and the air flow can be increased via fans, thereby improving the heat dissipation efficiency.

When installed, the water block is aligned with the heat source, and is fixedly arranged above the heat source by using brackets. The air-cooling module is fixedly arranged above the water pump 4 to complete the installation.

Described above are several embodiments of the present disclosure, which are described in a specific and detailed manner, but are not to be construed as a limitation of the scope of the present disclosure. It should be pointed out that for one of ordinary skill in the art, several variations and improvements made without departing from the spirit of the present disclosure shall be included in the scope of the present disclosure defined by the appended claims.

What is claimed is:

1. A water block, comprising:
a water pump;
an air-cooling module; and
a multi-layer heat-conducting structure;
wherein the air-cooling module is provided above the water pump, and a pump bottom casing is provided below the water pump; the multi-layer heat-conducting structure is provided below the pump bottom casing, and a heat-conducting bottom casing is provided below the multi-layer heat-conducting structure; the multi-layer heat-conducting structure comprises a top layer, a main body, an interlayer, and a bottom layer from top to bottom; and a first heat-dissipation fin with a multi-layer structure is provided inside the multi-layer heat-conducting structure, wherein the main body of the multi-layer heat-conducting structure, the interlayer of the multi-layer heat-conducting structure and the bottom layer of the multi-layer heat-conducting structure are configured to together form a first chamber; the top layer of the multi-layer heat-conducting structure and the main body of the multi-layer heat-conducting structure are configured to together form a second chamber; the water pump is provided with a first water inlet and a first water outlet; the pump bottom casing is provided with a second water inlet and a second water outlet; the multi-layer heat-conducting structure is provided with a third water inlet and a third water outlet; and water flows from the second water inlet into the third water inlet, passes through the first chamber to the second chamber and then flows out of the third water outlet, and enters the first water inlet through the second water outlet and then flows out of the first water outlet.

2. The water block of claim 1, wherein the air-cooling module comprises an air-cooling top cover, an air-cooling fan blade, and an air-cooling shell.

3. The water block of claim 2, wherein the air-cooling shell is cylindrical, and is provided with a notch in an L-shape; a fan chamber is provided inside the air-cooling shell; a snap-fit groove is provided above the fan chamber, and is configured to be matched with the air-cooling top cover; and a separator is provided below the fan chamber.

4. The water block of claim 3, wherein a second heat-dissipation fin is provided on an outer circumference of the pump bottom casing; a side of the pump bottom casing is provided with a water inlet; and a position where the water inlet is located is corresponding to a position of the notch of the air-cooling shell.

5. The water block of claim 1, wherein the air-cooling module comprises an air-cooling fan blade; and the air-cooling fan blade is connected to a turbine axis of the water pump.

6. The water block of claim 1, wherein the water block further comprises a heat pipe; a first portion of the heat pipe is provided above the multi-layer heat-conducting structure, and a second portion of the heat pipe is provided below the multi-layer heat-conducting structure.

7. The water block of claim 6, wherein the heat pipe is U-shaped, and the number of the heat pipe is one or more.

8. The water block of claim 1, wherein the first heat-dissipation fin comprises a top heat-dissipation fin layer, a heat-dissipation fin interlayer and a bottom heat-dissipation fin layer; the top heat-dissipation fin layer is provided between the top layer of the multi-layer heat-conducting structure and the main body of the multi-layer heat-conducting structure; the heat-dissipation fin interlayer is provided between the main body of the multi-layer heat-conducting structure and the interlayer of the multi-layer heat-conducting structure; and the bottom heat-dissipation fin layer is arranged between the interlayer of the multi-layer heat-conducting structure and the bottom layer of the multi-layer heat-conducting structure.

9. The water block of claim 1, wherein a first bracket and a second bracket are provided between the pump bottom casing and the heat-conducting bottom casing.

* * * * *